(12) United States Patent
Seller et al.

(10) Patent No.: US 11,456,852 B2
(45) Date of Patent: Sep. 27, 2022

(54) TRANSMITTER, RECEIVER, AND METHOD FOR CHIRP-MODULATED RADIO SIGNALS

(71) Applicant: Semtech Corporation, Camarillo, CA (US)

(72) Inventors: Olivier Bernard André Seller, Saint Soulle (FR); Christophe Jean Jacques Devaucelle, Boudevilliers (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 17/327,326

(22) Filed: May 21, 2021

(65) Prior Publication Data
US 2021/0367752 A1    Nov. 25, 2021

(30) Foreign Application Priority Data
May 25, 2020    (EP) .................................... 20176339

(51) Int. Cl.
*H04L 27/10* (2006.01)
*H04L 7/04* (2006.01)
(Continued)

(52) U.S. Cl.
CPC .............. *H04L 7/048* (2013.01); *H04B 1/69* (2013.01); *H04L 1/0061* (2013.01); *H04B 2001/6912* (2013.01); *H04L 27/10* (2013.01)

(58) Field of Classification Search
CPC ...... H01Q 1/3233; H01Q 21/065; H01Q 3/24; H01Q 1/3283; H01Q 3/40; H01Q 13/10;
(Continued)

(56) References Cited

U.S. PATENT DOCUMENTS 5,619,527 A * 4/1997 Kuroyanagi ............. H04B 1/71
375/147
5,751,703 A * 5/1998 Kobayashi ........... H04B 7/2643
370/321
(Continued)

FOREIGN PATENT DOCUMENTS

EP      0952713 A2    10/1999
EP      2449690 A1    5/2012
(Continued)

*Primary Examiner* — Eva Y Puente
(74) *Attorney, Agent, or Firm* — Blank Rome LLP

(57) ABSTRACT

Transmitter for chirp-modulated radio signals comprising a chirp generator configured to generate a series of chirp signals, wherein each chirp carries an element of information encoded as a cyclic shift, and has a phase encoding an error correction code dependent form the cyclic shift of the chirp, the transmitter further comprising a modulator configured to modulate the series of chirp onto a radio signal and a radio transmitter, transmitting the radio signal. receiver for chirp-modulated radio signals, comprising a clock unit and a demodulator configured for demodulating a (Continued)

series of received chirps signal, the demodulator having a dechirp unit, configured for determining a cyclic shift of each received chirp relative to a base chirp and an error correction code based on a phase of the received chirp, the receiver having a synchronism correction unit configured to detect and/or correct an error in the clock unit based on the error correction code.

15 Claims, 3 Drawing Sheets

(51) Int. Cl.
*H04B 1/69* (2011.01)
*H04L 1/00* (2006.01)

(58) Field of Classification Search
CPC ........ H01Q 21/0087; H01Q 1/42; H01Q 1/38; H04L 27/103; H04L 27/10; H04L 27/2657; H04L 27/265; H04L 1/0002; H04L 1/004; H04L 27/20; H04L 27/26522; H04B 2001/6912; H04B 1/69; H04B 17/318; H04B 17/336; H04B 3/23; H04B 10/2507; H04B 17/13; H04B 17/14; H04B 17/21
USPC .......................................................... 375/308
See application file for complete search history.

(56) References Cited

U.S. PATENT DOCUMENTS

| | | |
|---|---|---|
| 6,252,882 B1 * | 6/2001 | Matsui ..................... H04B 1/69 |
| | | 375/139 |
| 6,549,562 B1 | 4/2003 | Olaker et al. |
| 6,614,853 B1 | 9/2003 | Koslar et al. |
| 6,940,893 B1 | 9/2005 | Pinkney et al. |
| 8,971,379 B2 | 3/2015 | Hiscock |
| 10,530,628 B1 * | 1/2020 | Yoo ....................... H04L 27/103 |
| 2005/0058218 A1 * | 3/2005 | Jenkins ................... H04B 1/69 |
| | | 375/295 |
| 2016/0094270 A1 | 3/2016 | Seller |
| 2019/0056478 A1 * | 2/2019 | Millar ..................... G01S 7/352 |

FOREIGN PATENT DOCUMENTS

| | | |
|---|---|---|
| EP | 2763321 A1 | 8/2014 |
| EP | 3264622 A1 | 1/2018 |
| WO | WO-2011/000936 A1 | 1/2011 |

* cited by examiner

TRANSMITTER, RECEIVER, AND METHOD FOR CHIRP-MODULATED RADIO SIGNALS

REFERENCE DATA

This patent application claims priority from European patent application EP20176339.8 of May 25, 2020.

TECHNICAL DOMAIN

The present invention concerns, in embodiment, receivers and transmitters for chirp-modulated, spread-spectrum radio signals.

RELATED ART

A known problem in the field of radio communication is that of exchanging data wirelessly at ever larger distances, despite interferences, fading, and attenuation in the radio channel. When wireless communication is used to connect portable devices, appliances and sensors, as it is increasingly the case, there is the additional requirement of reducing power expenditure. Chirp-modulated signals, as embodied by the LoRa modulation for example, have been used successfully in this context.

Chirp-modulated signals are used in the LoRa™ RF technology of Semtech Corporation, which will be referred simply as LoRa in the following of this disclosure. As disclosed among others by documents EP 2763321 A1, EP 3264622 A1, and EP 2449690 A1, LoRa is based on the transmission and reception of symbols that are obtained by cyclic shifts of one "base" symbol, that is a frequency chirp having a determined slope and bandwidth.

Document U.S. Pat. No. 8,971,379 B2 discloses a system of chirp spread-spectrum communication in which data are transmitted by symbols that include chirps characterized by a slope, a cyclic shift, and a complex phase shift.

Chirp generation in various radiofrequency circuits is known also from U.S. Pat. No. 6,549,562 B1, which describes a method for generating modulated chirp signal, while EP 0952713 A2 discloses a synchronization process based on chirp signals.

U.S. Pat. No. 6,940,893 B1 and U.S. Pat. No. 6,614,853 B1, among others, disclose generation and use of chirp signal by passing an impulsive signal through a dispersive filter, and communication schemes based thereupon.

A distinct advantage of using chirp-modulated radio signal in machine-to-machine communication is that they can be demodulated and processed also by devices with low power consumption and processing speed. There is however a need to improve the error-detection and error-correction capability of receivers, as well as the ability to align the internal time reference of the receiver with those at the transmitter's side.

While LoRa communication system have the capability of detecting and correcting time or frequency synchronization errors between the transmitter and the receiver, this is limited to errors that are, expressed in time, less than one sampling period. Larger errors are not detected as such but are perceived by the receiver as a cyclic shift, creating a demodulation error of an integer number of modulation values.

Although LoRa data frames include correction codes that allow detecting and correcting such errors, these errors shall not occur on every symbol. The opening symbols of each frame cannot be corrected in this way, because an error at the beginning would propagate to all symbols. The same holds for the first symbols received after a fading of the signal inside a frame.

An aim of the present invention is of providing a modulation method and a corresponding receiver capable of fulfilling these tasks with a simple architecture, and therefore capable of being produced at low cost and deployed in large numbers.

SHORT DISCLOSURE OF THE INVENTION

According to the invention, these aims are attained by the object of the attached claims, and especially by a transmitter for chirp-modulated radio signals comprising a chirp generator configured to generate a series of chirp signals, wherein each chirp carries an element of information encoded as a cyclic shift, and has a phase encoding an error correction code dependent form the cyclic shift of the chirp. Referring to FIG. 5, the transmitter further comprises a modulator configured to modulate the series of chirp onto a radio signal and a radio transmitter, transmitting the radio signal; as well as by a receiver for chirp-modulated radio signals, comprising a clock unit and a demodulator configured for demodulating a series of received chirps signal, the demodulator having a dechirp unit, configured for determining a cyclic shift of each received chirp relative to a base chirp and an error correction code based on a phase of the received chirp, the receiver having a synchronism correction unit configured to detect and/or correct an error in the clock unit based on the error correction code; and by the corresponding methods. The synchronism correction unit may also be part of the demodulator.

The dependent claims relate to advantageous but not essential elements of the invention including a phase offsets introduced in the chirps in which the error correction code is added to an alignment term that depends from the cyclic shift of each chirp in a quadratic way, whereby the alignment term compensates a phase shift introduced by the cyclic shift and a method of determining the cyclic shift in received chirps that includes computing an oscillating digital signal by multiplying the received chirp by a complex-conjugate of a base chirp, determining the main frequency of the oscillating signal by a Fourier transform, and deducing the cyclic shift from the main frequency, classifying the chirps in a set of subclasses in the transmitter and determine their phase modulation, or the phase change based on the subclasses. Likewise, the receiver of the invention may be arranged to detect and correct errors based on a phase difference between successive chirps and to classify the received chirps into subclasses, based on their modulation values.

SHORT DESCRIPTION OF THE DRAWINGS

Exemplar embodiments of the invention are disclosed in the description and illustrated by the drawings in which:

FIG. 1 shows, in schematic simplified fashion, the structure of a radio modem according to one aspect of the present invention.

FIG. 2*a* plots the instantaneous frequency of a base chirp and of a modulated chirp according to one aspect of the invention. The phase of the same signals is represented in FIG. 2*b*, and FIG. 2*c* plots the real and of the complex component of the base chirp and of a modulated chirp, in the time domain, and in the baseband representation.

EXAMPLES OF EMBODIMENTS OF THE PRESENT INVENTION

Figure 1:
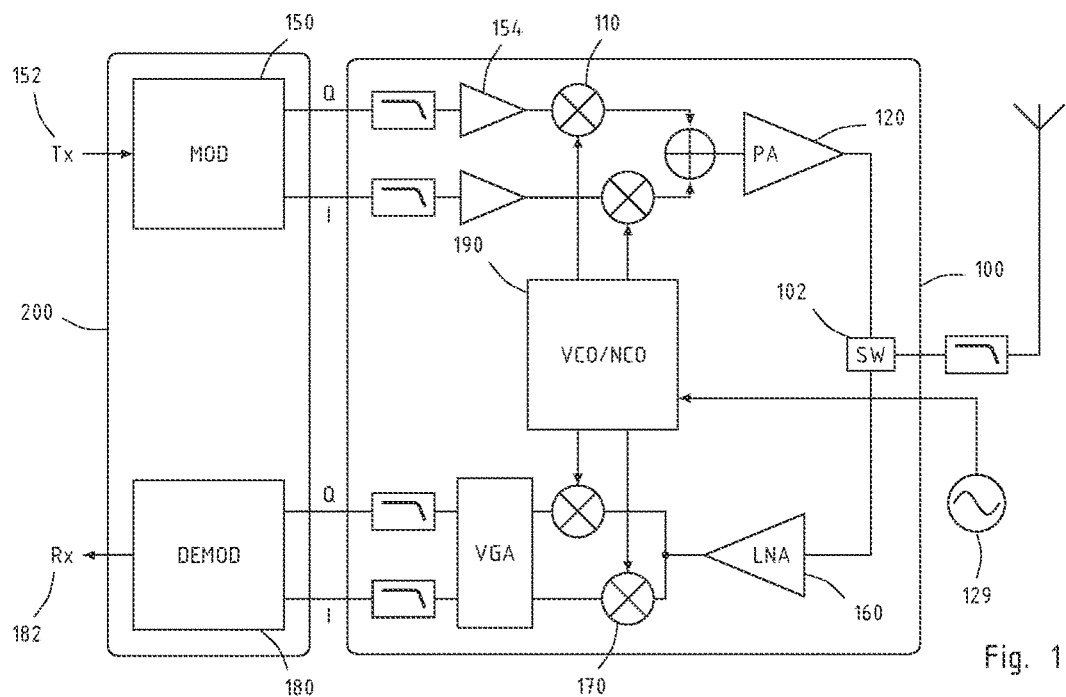

Several aspects of the chirp modulation technique employed in the present invention are described in European Patent EP2449690, which is hereby incorporated by reference, and will be reminded here summarily. The radio transceiver that is schematically represented in FIG. 1 is a possible embodiment of the invention. The transceiver includes a baseband section 200 and a radiofrequency section 100. It includes a baseband modulator 150 that generates a baseband complex signal based on the digital data 152 at its input. This is then converted to the desired transmission frequency by the RF section 100, amplified by the power amplifier 120, and transmitted by the antenna.

Once the signal is received on the other end of the radio link, it is processed by the receiving part of the transceiver of FIG. 1 that comprises a low noise amplifier 160 followed to a down-conversion stage 170 that generates a baseband signal (which is again a complex signal represented, for example by two components I, Q) comprising a series of chirps, then treated by the baseband processor 180, whose function is the reverse of that of the modulator 150, and provides a reconstructed digital signal 182.

As discussed in EP2449690, the signal to be processed comprises a series of chirps whose frequency changes, along a predetermined time interval, from an initial instantaneous value $f_0$ to a final instantaneous frequency $f_1$. It will be assumed, to simplify the description, that all the chirps have the same duration T, although this is not an absolute requirement for the invention.

The chirps in the baseband signal can be described by the time profile f(t) of their instantaneous frequency or also by the function $\phi(t)$ defining the phase of the signal as a function of the time. Importantly, the processor 180 is arranged to process and recognize chirps having a plurality of different profiles, each corresponding to a symbol in a predetermined modulation alphabet.

Figure 2A:
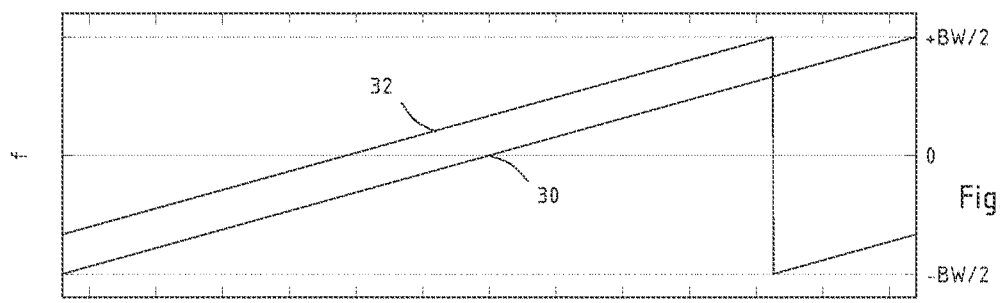
Figure 2B:
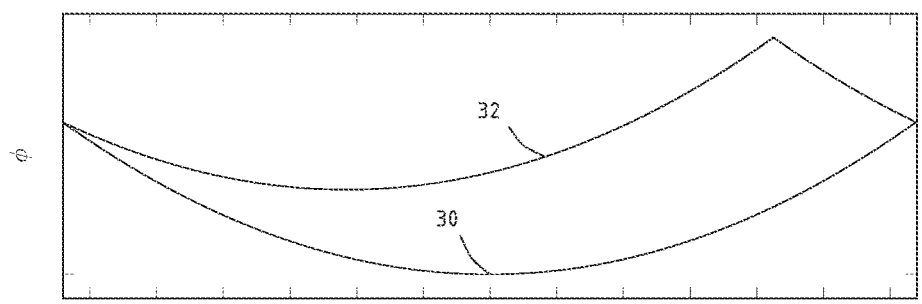
Figure 2C:
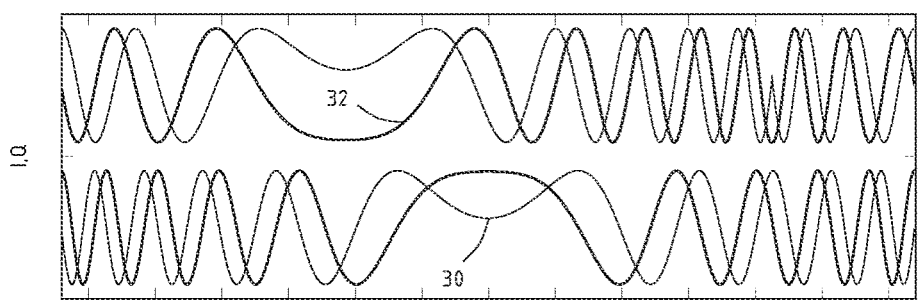

According to an important feature of the invention, the received signal Rx can comprise base chirp (also called unmodulated chirps in the following) that have specific and predefined frequency profile, or one out of a set of possible modulated chirps, obtained from base chirps by time-shifting cyclically the base frequency profile. FIGS. 2a and 2b illustrate, by way of example, possible frequency and phase profiles of a base chirp and of one modulated chirps between the time instant $t=t_0$ at the beginning of a chirp and the instant $t=t_1$ at the end of the chirp, while FIG. 2c shows the corresponding baseband signals in the domain of time. The horizontal scale corresponds for example to a symbol and, although the plots are drawn as continuous, they in fact represent a finite number of discrete samples, in a concrete implementation. As to the vertical scales, they are normalized to the intended bandwidth or to the corresponding phase span. The phase is represented in FIG. 2b as if it were an unbounded variable, but it may in fact span across several revolutions in a concrete implementation.

In the example depicted, the frequency of a base chirps increases linearly from an initial value −BW/2 to a final value BW/2 where BW denotes the bandwidth spreading, but descending chirps or other chip profiles are also possible. Thus, the information is encoded in the form of chirps that have one out of a plurality of possible cyclic shifts with respect to a predetermined base chirp, each cyclic shift corresponding to a possible modulation symbol or, otherwise said, the processor 180 needs to process a signal that comprises a plurality of frequency chirps that are cyclically time-shifted replicas of a base chirp profile, and extract a message that is encoded in the succession of said time-shifts.

FIG. 2c is a plot of the real and imaginary component, I and Q, of the baseband signal corresponding to a base chirp, in the time domain.

As it will be clearer in the following, the signal may include also conjugate chirps that are complex conjugate of the base unmodulated chirp. One can regard these as down-chirps, in which the frequency falls from $f_0$=BW/2 to $f_1$=−BW/2.

The operation of evaluating a time shift of a received chirp with respect to a local time reference may be referred to in the following as "dechirping", and can be carried out advantageously by a de-spreading step that involves multiplying the received chirp by a complex conjugate of a locally-generated base chirp, sample by sample. This gives rise to an oscillating digital signal whose main frequency can be shown to be proportional to the cyclic shift of the received chirp. The demodulation then may involve a Fourier transform of the de-spread signal. The position of the maximum of the Fourier is a measure of the cyclic shift, and of the modulation value. In mathematical terms, denoting the k-th received symbol with $S_j^k$, where k is a symbol index, and j a sample index, the corresponding modulation value is given by $m(k)=\arg\max_n (|X(k, n)|)$ where $X(n, k)=F(S_j^k \cdot \overline{b}_j)$ denotes the Fourier transform of the product between $S_j^k$ and the conjugate of a base chirp $\overline{b}_j$. Other manners of demodulating the signal and extracting the cyclic shift of each symbol are possible, however.

Figure 3:
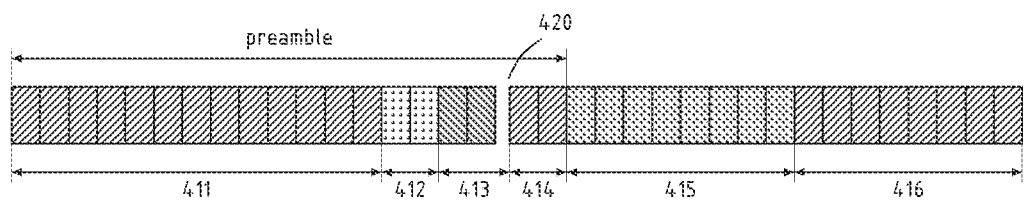
FIG. 3 represents schematically the structure of data frames exchanged between two devices in the frame of the present invention.

Preferably, the signal transmitted and received by the invention are organised in frames that include a preamble and a data section, suitably encoded. The preamble and the data section comprise a series of chirps modulated and/or unmodulated, that allows the receiver to time-align its time reference with that of the transmitter, retrieve an element of information, perform an action, or execute a command. In the frame of the invention, several structures are possible for the data frame, depending inter others, on the channel condition, transmitted data or command. FIG. 3 represents schematically, a frame structures that can be employed in various aspects of the present invention.

In the presented example, the frame has a preamble followed by a data header 415 and a data payload 416. The preamble starts with detect sequence 411 of base (i.e. un-modulated, or with cyclic shift equal to zero) symbols. The detect sequence 411 is used in the receiver to detect the beginning of the signal and, preferably, perform a first synchronisation of its time reference with the time reference in the transmitter. By demodulating the detect sequence, the receiver can determine a shift amount and adapt the frequency and phase of its clock with those of the sender, thus allowing the decoding of the following data.

The end of the detect sequence is marked by one or more, preferably two, frame synchronisation symbols 412 that are chirps modulated with predetermined values, for example a first chirp with a modulation value of 4, and a second one with the opposite modulation N−4. These modulated symbols are used to get a frame synchronization as disclosed by EP 2763321 A1 and EP 3264622 A1.

Frequency synchronisation symbols 413 that consist in one or more, preferably two chirps that are complex conjugate of the base unmodulated chirp, hence they have an opposite slope to all other symbols. These are preferably followed by a silence 420 to allow the receiver's alignment, fine synchronisation symbols 414 that are unmodulated base chirps used to evaluate and correct a residual timing drift.

According to an important aspect of the present invention, information is transmitted by symbols each of which is a chirp having a determined length and slope, and the information is encoded in a cyclic shift of the symbol, as in the standard LoRa modulation and, in addition to this modulation by the cyclic shift, each symbol is synthesized with a given phase offset that is used to transmit an error correction code to the receiver.

In the original LoRa modulation, the complex phase of each symbol is defined modulo an undetermined offset. In many implementations, for example those in which the symbols are synthesized by a voltage controlled oscillator, the phase can never show discontinuities, and each symbol has an initial phase that is implicitly determined by its cyclic shift, such that the phase is continuous at symbol borders, as shown in FIG. 2b. This requirement can be relaxed, however, and each symbol could be synthesized with an arbitrary phase offset. In the following, the wording "phase of a chirp" may refer to a phase offset of the whole chirp relative to the phase required by inter-symbol continuity.

According to an aspect of the invention, the phase is evaluated from the phase at the peak of the Fourier transform after the dechirping operation. If $X(n, k)=F(S_j^k \cdot \bar{b}_j)$ denotes the Fourier transform and $m(k)=\arg\max_n(|X(k,n)|)$ the modulation value, then the phase of each symbol can be determined by $\phi(k)=\arg(X(k, m(k))$. Although other ways of estimating the phase are possible and available to the invention, this algorithm is convenient where the spectrum $X(k, n)$ is already available and is relatively immune to noise.

It is convenient to define a "standard" phase shift $a(m)$ which depends from the modulation value m in such a way that each demodulation peak, after dechirp and Fourier transform shows the same phase. The standard phase shift can be regarded as an alignment phase term. It depends from the modulation value (the cyclic shift) in a quadratic way and is in fact the same as the phase shift implicitly introduced by requiring inter-symbol phase continuity, provided all the symbols have the same slope and the same duration.

According to an aspect of the invention, the phase offset of each symbol comprises an alignment term and, summed thereto, a phase modulation term that encodes an error correction code that the receiver can use to detect and/or correct a lack of synchronization (a misalignment in time or frequency) between its clock and the transmitter's one. As mentioned in the introduction, in the standard LoRa modulation, a time misalignment in a symbol by more than one sample is undistinguishable from a cyclic shift introduced by modulation. The present invention introduces redundant information in symbols that allows to overcome this shortcoming.

The phase shift can be demodulated at the receiver in various ways, including by looking at the phase of the demodulation peak after dechirping and Fourier transform. Since the symbols include the alignment term, the receiver can determine the difference between the phase shifts in two symbols by comparing the phases of the respective modulation peaks $\phi(k)=\arg(X(k,m(k))$.

The desired detection and correction can be obtained by introducing phase shift that depend from the cyclic shift in various ways, such that when the receiver demodulates a symbol, the cyclic shift and the phase shift can be compared, and synchronization error can be distinguished from normal modulation.

In a possible embodiment of the invention, the possible modulation values are divided in several subclasses, for example according to the remainder obtained by modulation value (the cyclic shift) modulo a given divider and cannot be detected or corrected. The receiver can then determine the synchronization error from the differences between the phases of the modulation peaks of two symbols that do not have the same modulation value.

For example, the modulation values could be divided in three subclasses, C0, C1, and C2, according to the remainder of the modulation value modulo three. Each subclass has associated a value of phase.

TABLE 1

|  | 0 mod 3 (C0) | 1 mod 3 (C1) | 2 mod 3 (C2) |
| --- | --- | --- | --- |
| Modulation phase | 0° | 0° | 120° |

Figure 4:
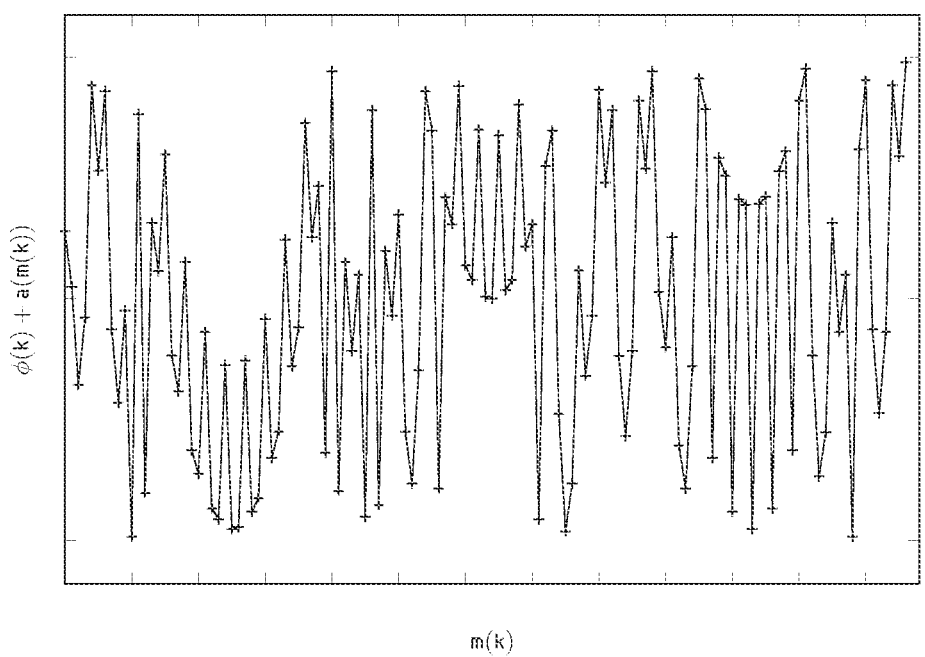
FIG. 4 is a plot showing the relation between modulation value and chirp phase in an embodiment of the invention.
Figure 5:
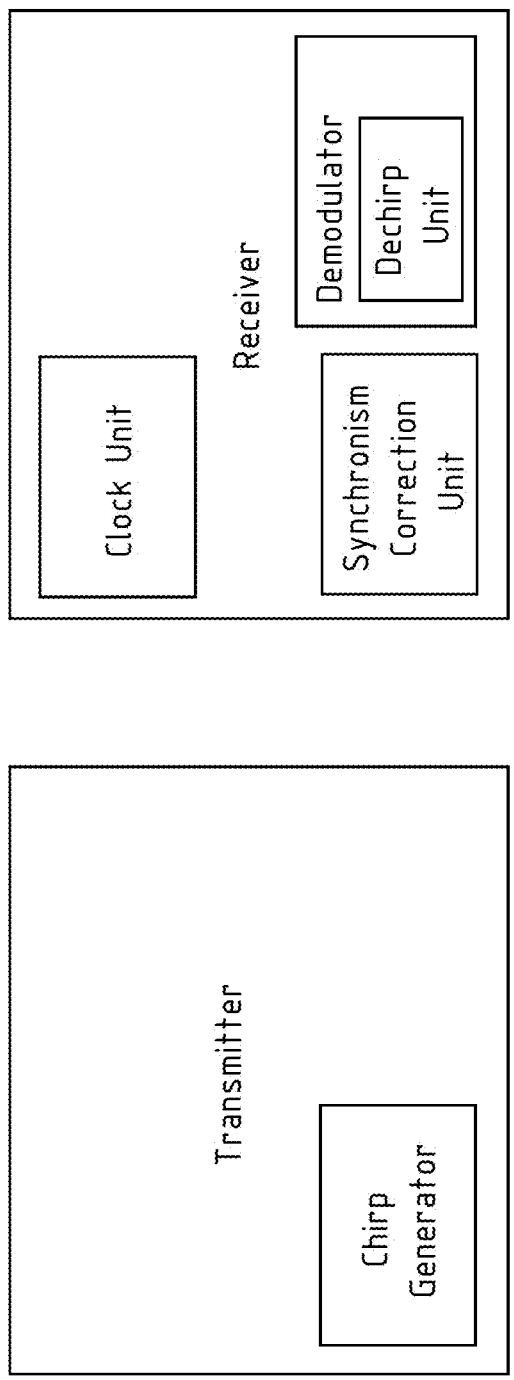
FIG. 5 is a schematic drawing of a transmitter and a receiver.

With this arrangement, the phase difference between two symbols is determined by their subclasses. FIG. 4 is a plot showing the relation between the modulation value m(k) and the chirp phase according to this variant of the invention. The phase of each chirp is the sum of the quadratic alignment term a(m(k)) introduced above and of the phase modulation term $\phi(k)$ that depend from the subclass as shown in table 1.

A synchronization error equivalent to one sampling time, for example, would shift the received modulation value and alter the subclasses to which the symbols belong, but it would have no effect on their relative phase difference. Synchronization errors can therefore be detected and corrected from the observation of two or more symbols belonging to different subclasses. The receiver is arranged to classify the received symbols in the respective subclasses, determine their phase difference, and compare the phase difference with that of the table 1. The comparison provides the synchronization status for errors comprised between −1 and +1, as shown by table 2.

TABLE 2

| | phase difference | | |
| --- | --- | --- | --- |
| error | C1, C0 | C2, C0 | C2, C1 |
| −1 | +120° | 0° | −120° |
| 0 | 0° | +120° | +120° |
| +1 | −120° | −120° | 0° | cases [C0, C1], [C0, C2], [C1, C2] are not shown since they are the opposite of those shown.

To fix the ideas with a concrete example, if two consecutive symbols with modulation values of 87 and 46, are received with a phase difference close to +120°, that is the phase of the symbol with cyclic shift 46 is 120° higher than that of the symbol with cyclic shift 87. The receiver can determine that they belong to subclasses C1 and C0, and that the synch error is −1. Therefore, the correct modulation values are 47 and 88.

Similar schemas can be devised to increase the range of correction of the synchronization error. For example, dividing the symbol in five subclasses according to the remainder of the modulation value modulo 5, allows the detection of synchronization error of ±2, ±1, or 0.

TABLE 3

|  | C0 | C1 | C2 | C3 | C4 |
|---|---|---|---|---|---|
| Modulation phase | 0° | 0° | 140° | 70° | 140° |

With this arrangement, the receiver can detect and correct errors ranging from −2 to +2 modulation positions.

TABLE 4

| | phase difference | | | | | | | | | |
|---|---|---|---|---|---|---|---|---|---|---|
| error | C1, C0 | C2, C0 | C3, C0 | C4, C0 | C2, C1 | C3, C1 | C4, C1 | C3, C2 | C4, C2 | C4, C3 |
| −2 | 70° | −70° | −70° | 70° | −140° | −140° | 0° | 0° | +140° | +140° |
| −1 | −140° | −140° | 0° | −70° | 0° | +140° | +70° | +140° | +70° | −70° |
| 0 | 0° | +140° | +70° | +140° | +140° | +70° | +140° | −70° | 0° | +70° |
| +1 | +140° | +70° | +140° | 0° | −70° | 0° | −140° | +70° | −70° | −140° |
| +2 | −70° | 0° | −140° | −140° | +70° | −70° | −70° | −140° | −140° | 0° |

In a variant of the invention, the phase is differential encoded: the modulation symbols are again divided in subclasses and each subclass is associated with a phase change relative to the phase of the previous symbol. This schema allows the detection of synchronism error from the observation of two symbols without restrictions, and may be more robust than the previous example in some use cases, for example if the error is in the first received symbol or when the cyclic shift repeats itself in a series of symbols.

As in the previous example, the modulation symbols could be subdivided in three subclasses according to the remainder of the modulation value modulo three. Each subclass has associated a value of phase change relative to the phase of the preceding symbol.

TABLE 5

|  | 0 mod 3 (C0) | 1 mod 3 (C1) | 2 mod 3 (C2) |
|---|---|---|---|
| Modulation phase change | +0° | +120° | −120° |

In this schema, the phase difference between two consecutive symbols is determined uniquely by the subclass of the second symbol as shown in the table below

TABLE 6

| error | Cx, C0 | Cx, C1 | Cx, C2 |
|---|---|---|---|
| −1 | +120° | −120° | 0° |
| 0 | 0° | +120° | −120° |
| +1 | −120° | 0° | +120° |

The concept can be extended to five subclasses to detect errors in the −2, . . . , +2 range

TABLE 7

|  | C0 | C1 | C2 | C3 | C4 |
|---|---|---|---|---|---|
| Modulation phase change | 0° | +72° | +144° | −144° | −72° |

In general terms, the differential-encoded variant allows the detection of error between −n and +n by dividing the symbol in n subclasses, each associated to a change of phase $\Delta\phi = x360°/(2n+1)$ where $x \in \{0, 2n\}$.

The invention claimed is:

1. A transmitter for chirp-modulated radio signals comprising a chirp generator configured to generate a series of chirp signals, wherein each chirp carries an element of information encoded as a cyclic shift, and has a phase encoding an error correction code dependent from the cyclic shift of the chirp, the transmitter further comprising a modulator configured to modulate the series of chirp signals onto a radio signal and a radio transmitter, transmitting the radio signal.

2. The transmitter of claim 1, wherein the phase of the chirps is the sum of a phase modulation term encoding the error correction code and an alignment term that depends from the cyclic shift of each chirp in a quadratic way, whereby the alignment term compensates a phase shift introduced by the cyclic shift.

3. The transmitter of claim 2, wherein the chirp generator is configured to classify the chirps in a set of subclasses, based on the cyclic shift of each chirp, and determine the phase modulation term of each chirp based on the subclass of each chirp.

4. The transmitter of claim 2, wherein the chirp generator is configured to classify the chirps in a set of subclasses, based on the cyclic shift of each chirp, and determine for each chirp a phase change based on the subclass of each chirp, wherein the phase change of each chirp summed to the phase of a preceding chirp determines the phase modulation of each chirp.

5. A receiver for chirp-modulated radio signals, comprising a clock unit and a demodulator configured for demodulating a series of received chirp signal, the demodulator having a dechirp unit, configured for determining a cyclic shift of each received chirp relative to a base chirp and an error correction code based on a phase of the received chirp, the receiver having a synchronism correction unit configured to detect and/or correct an error in the clock unit based on the error correction code.

6. The receiver of claim 5, wherein the determining a cyclic shift includes computing an oscillating signal by multiplying each sample of the received chirp with a corresponding sample of a complex-conjugate of the base chirp, computing a Fourier transform of the oscillating signal, determining a position of a peak in the Fourier transform.

7. The receiver of claim 6, wherein the determining an error correction code includes determining a complex phase of the Fourier transform at the position of the peak.

8. The receiver of claim 5, wherein the synchronism correction unit is configured for correcting the cyclic shift of the received chirps and/or adjusting the clock unit of the receiver based on the error correction codes in successive chirps.

9. The receiver of claim 8, wherein the synchronism correction unit is arranged to classify the received chirps in subclasses based on their estimated cyclic shifts, and to determine the synchronism based on a phase difference between successive chirps.

10. A method of transmitting data as chirp-modulated radio signals, comprising:
- generating a series of chirps having each a cyclic shift encoding data and a phase;
- wherein the phase of each chirp encodes an error correction code dependent from the cyclic shift of the chirp;
- transmitting the series of chirps in a radio signal.

11. The method of claim 10, including
- receiving the radio signal in a receiver, demodulating a series of received chirp signals;
- determining the cyclic shift of each received chirp signal;
- determining the error correction code based on the phase of the received chirp signal; and
- detecting and/or correcting a time error or a frequency error based on the error correction code.

12. The method of claim 11, comprising determining a phase offsets introduced in the chirp signals comprise the error correction code summed to an alignment term that depends from the cyclic shift of each chirp signal in a quadratic way, whereby the alignment term compensates a phase shift introduced by the cyclic shift.

13. The method of claim 12, comprising correcting the cyclic shift of the received chirps and/or adjusting a clock unit of the receiver, based on a difference between error correction codes in successive chirps.

14. The method of claim 12, comprising classifying the chirps in a set of subclasses, based on the cyclic shift of each chirp, and determining the phase modulation term of each chirp based on the subclass of each chirp.

15. The method of claim 12, comprising classifying the chirps in a set of subclasses, based on the cyclic shift of each chirp, and determining for each chirp a phase change based on the subclass of each chirp, wherein the phase change of each chirp summed to the phase of a preceding chirp determines the phase modulation of each chirp.

\* \* \* \* \*